(12) United States Patent
Shimizu et al.

(10) Patent No.: US 7,119,000 B2
(45) Date of Patent: Oct. 10, 2006

(54) METHOD OF MANUFACTURING SEMICONDUCTOR DEVICE

(75) Inventors: Kozo Shimizu, Kawasaki (JP); Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/771,391

(22) Filed: Feb. 5, 2004

(65) Prior Publication Data
US 2004/0180527 A1  Sep. 16, 2004

(30) Foreign Application Priority Data
Mar. 13, 2003  (JP) .............................. 2003-068516

(51) Int. Cl.
*H01L 21/44* (2006.01)
(52) U.S. Cl. ...................... 438/597; 438/598; 438/614; 438/615; 438/652; 438/658; 438/660; 438/666; 438/667; 438/669; 438/672
(58) Field of Classification Search ........ 438/597–598, 438/614–615, 618, 652, 658, 660, 666–667, 438/669, 672
See application file for complete search history.

(56) References Cited

U.S. PATENT DOCUMENTS

| | | | | |
|---|---|---|---|---|
| 5,089,881 A | * | 2/1992 | Panicker | .................... 257/691 |
| 5,356,509 A | * | 10/1994 | Terranova et al. | ............ 117/58 |
| 5,461,261 A | * | 10/1995 | Nishiguchi | ................... 257/781 |
| 5,861,666 A | * | 1/1999 | Bellaar | ........................ 257/686 |
| 6,524,943 B1 | * | 2/2003 | Sakuyama | .................. 438/613 |
| 6,730,596 B1 | * | 5/2004 | Fukunaga et al. | .......... 438/660 |
| 2004/0079194 A1 | * | 4/2004 | Nakata et al. | ................. 75/255 |

FOREIGN PATENT DOCUMENTS

| | | |
|---|---|---|
| JP | 6-13382 | 1/1994 |
| JP | 2000-260819 | 9/2000 |

* cited by examiner

*Primary Examiner*—Lynne A. Gurley
(74) *Attorney, Agent, or Firm*—Westerman, Hattori, Daniels & Adrian, LLP.

(57) ABSTRACT

The resist film is provided on the surface of the substrate having electrodes, and openings are provided in the resist film at positions of the electrodes on the substrate. The first metal is supplied into the openings. The first metal is then heated to melt and coagulate it. The second metal is then supplied into the openings on the first metal. The first metal and the second metal are heated to melt and coagulate them. The resist film is finally removed. By this method, excellent solder bumps can be formed on the substrate without remnants of the resist film being left on the substrate.

8 Claims, 5 Drawing Sheets

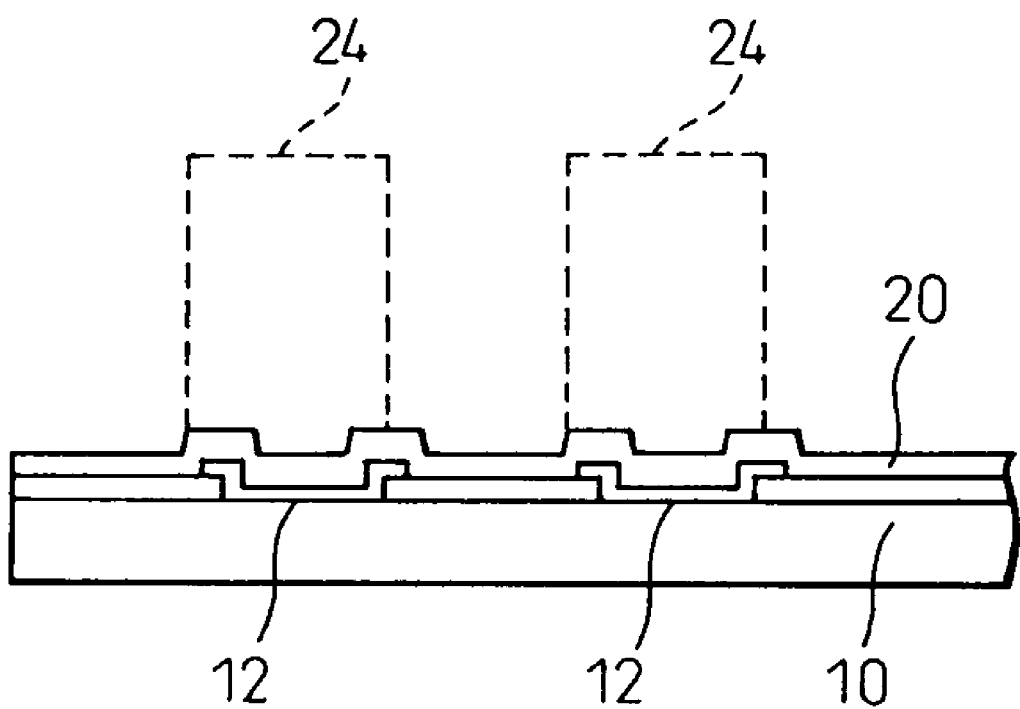

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Related Art

There is a strong demand for high density mounting of electronic parts, and the bare chip assembly system is being watched with keen interest. The connecting structure in the bare chip assembly has been changed from face-up mounting using a wire bonding method to face-down mounting using the flip chip joint and solder bumps. In the joint using the solder bumps, the solder bumps are formed on electrodes on the surface of a semiconductor element. Concerning the method of forming the solder bumps, a method using electrolytic plating is known (For example, refer to Japanese Unexamined Patent Publication (Kokai) No. 6-133382 (pages 3 to 4, FIG. 1)).

As shown in FIG. 5A in the attached drawings, in the conventional method of forming solder bumps, a resist (insulating film) 56 is provided on the surface of a semiconductor substrate 50, and openings are provided at the positions of the electrodes in the resist on the semiconductor substrate. Then, the metal 58, which becomes solder bumps, is supplied into the openings by means of electrolytic plating. This metal 58 is formed to a height so that the metal 58 protrudes from the surface of the resist.

According to this method, the larger the thickness of the resist is, the higher the bumps it is possible to form. In the case of forming the solder bumps at narrow pitches, the area of the solder bump becomes smaller, and therefore, it is preferable that the height of the solder bumps is increased so as to ensure a required quantity of solder. When the solder bumps are formed by means of electrolytic plating, it is possible to form solder bumps having a large height at narrow pitches at a relatively low manufacturing cost.

The resist can be provided by coating liquid photo-resist by means of spin coat, of alternatively, it is possible to use dry film resist of uniform thickness. As dry film resist having a large thickness can be easily procured, it is appropriate for forming tall bumps.

In the case where the thick resist is used, a problem is caused in which it is difficult to separate the resist from a semiconductor substrate. In the case where metal, which becomes solder bumps, is formed to such a height that it protrudes from the resist surface, a portion of the plated metal covers the resist surface, and the profile of the plated metal becomes a mushroom-shape, as shown in FIG. 5B. Therefore, it is not easy for a release agent to get between the resist and the plated metal and between the resist and the semiconductor substrate. In the case of using the dry film resist, the dry film resist is separated by causing an alkali solution to penetrate into the dry film resist so that the dry film resist can be swollen. If it is not easy for the release agent to penetrate between the resist and the plated metal and between the resist and the semiconductor substrate, the resist cannot be perfectly separated, and the remnants 60 of the resist remain in the peripheries of the solder bumps and on the surface of the semiconductor substrate in some cases. As the resist remnants 60 absorb moisture, ion migration occurs, which could be a cause of short circuits between the bumps. Therefore, in order not to leave the resist remnants, it is necessary to reduce the height of the solder bumps to be smaller than the thickness of the resist. For the above reasons, in the case where the solder bumps are formed at narrow pitches, it is difficult to ensure a quantity of solder required. When the quantity of solder is low, joining will become defective or the capacity of alleviating stress by the solder bumps is deteriorated, that is, the reliability of joining is lowered.

SUMMARY OF THE INVENTION

It is an object of the present invention to provide a method of manufacturing a semiconductor device by which excellent solder bumps can be formed at narrow pitches.

The present invention provides a method of manufacturing a semiconductor device comprising the steps of: forming an insulating film on the surface of a semiconductor element having an electrode on its surface or forming an insulating film on a surface of a semiconductor element or a circuit wiring board having electrodes on the surface thereof; forming openings in the insulating film by patterning the insulating film and then removing portions of the insulating film above the electrodes; supplying a first metal into the openings; heating the first metal to melt and coagulate the first metal; supplying a second metal into the openings on the first metal; heating the first metal and the second metal to melt and coagulate the first metal and the second metal; and removing the insulating film.

According to the above constitution, the insulating film can be easily removed from the substrate. Therefore, it is possible to form excellent solder bumps at narrow pitches.

BRIEF DESCRIPTION OF THE DRAWINGS

FIG. 3 is a view showing an example of an LSI wafer on which a conductor for plating is mounted;

DESCRIPTION OF THE PREFERRED EMBODIMENTS

The preferred embodiments of the present invention will now be explained below with reference to the drawings.

Figure 1A:
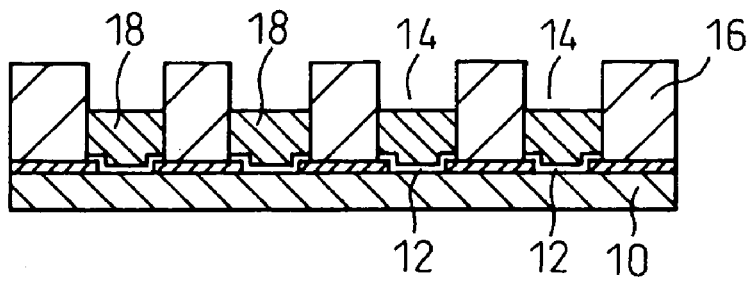
FIGS. 1A to 1E are views showing a method of forming solder bumps of an embodiment of the present invention.

FIGS. 1A to 1E are views showing a method of forming solder bumps of an embodiment of the present invention. In FIG. 1A, an LSI wafer (semiconductor substrate) 10 is prepared. The LSI wafer 10 has already been subjected to an integrated circuit manufacturing process, and electrodes 12 are already formed on the surface of the LSI wafer 10. As is well known, the electrodes 12 are connected to the integrated circuit. In this embodiment, solder bumps are formed on the LSI wafer 10, but it is possible to form the solder bumps on other substrates (for example, a circuit wiring board) having electrodes.

FIG. 3 is a view showing an example of the LSI wafer 10 having a conductor 20 for plating. The conductor 20 for plating is provided on the surface of the LSI wafer 10 by means of vapor deposition or electroless plating. After the solder bumps are formed, portions of the conductor 20 for plating located around the solder bumps are removed.

Referring to FIG. 1A, a resist (an insulating film) 16 is formed, the resist 16 having openings 14 at the positions of the electrodes 12. The resist 16 is first provided on the surface of the LSI wafer 10 having the electrodes 12, and the openings 14 are then provided in the resist 16 at positions of the electrodes 12 on the LSI wafer 10. The resist 16 can be provided in such a manner that a liquid photo-resist is coated by means of spin coat, or alternatively, a dry film resist can be used as the resist 16. The liquid photo-resist is heated and cured, and then the openings 14 are formed by means of photolithography process. The dry film resist is bonded to the LSI wafer 10, and after it is heated and cured, the openings 14 are formed by means of photolithography process. It is easy to procure such a dry film resist that the film is thick and the film thickness is uniform. Therefore, it is appropriate to use the dry film resist for forming tall solder bumps. Here, the dry film resist is used. In the photolithography process, the resist 16 is patterned and portions of the resist above the electrodes 12 are removed.

Next, a first metal 18 is supplied into the openings 14. The first metal 18 is supplied by means of electric plating or vapor deposition while the resist 16 is being used as a mask. In the embodiment, the first metal 18 is formed by means of electrolytic plating. At this time, the conductor 20 on the electrodes 12 is connected to the electric power source used for electric plating.

The first metal 18 has a characteristic in which the volume thereof increases when it is heated to be molten and coagulated. The first metal 18 is preferably Bi or an alloy containing Bi as a primary component thereof. A quantity of the first metal 18 to be supplied is adjusted in the range from 20 to 70 wt % of the solder bumps to be formed. Accordingly, the first metal 18 is accommodated in a lower portion of the opening 14.

Figure 1B:
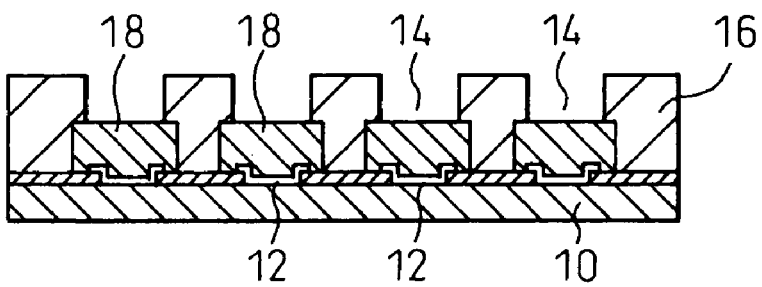

In FIG. 1B, the first metal 18 is subjected to the wet-back process. That is, the first metal 18 is heated to a temperature not lower than the melting point to be molten and coagulated.

Figure 1C:
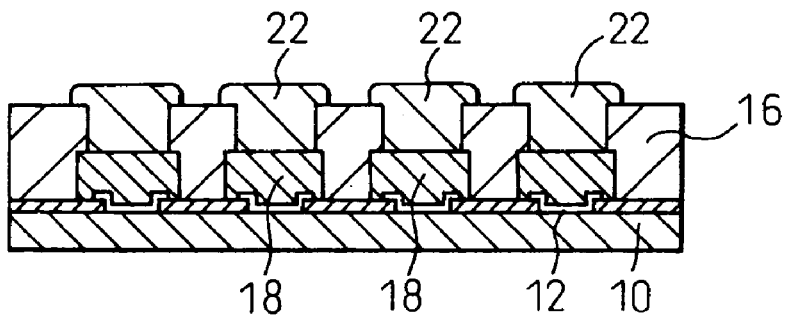
Figure 1D:
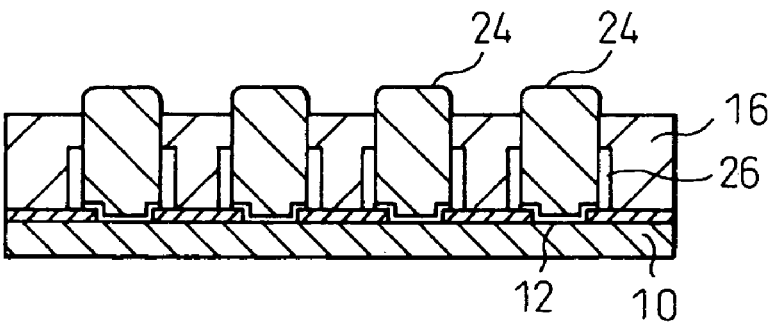
Figure 1E:
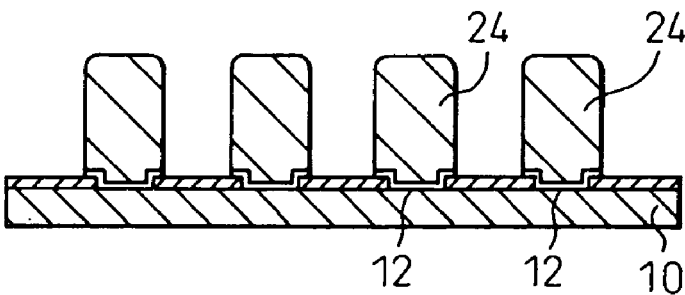
Figure 2A:
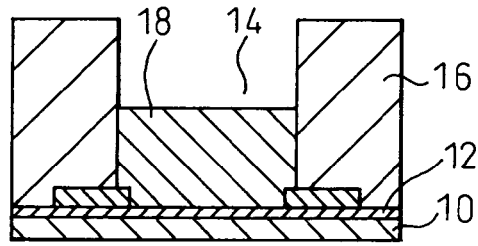
FIGS. 2A to 2D are enlarged views showing several steps in FIG. 1.
Figure 2B:
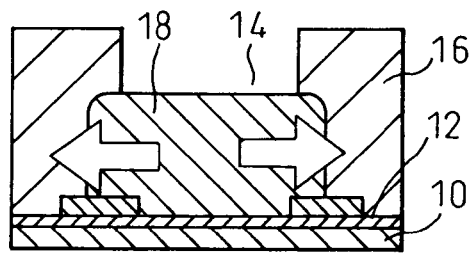

FIGS. 2A to 2D are enlarged views showing several steps of FIG. 1. FIG. 2A is a view corresponding to FIG. 1A, showing a state in which the first metal 18 is supplied into the openings 14. FIG. 2B is a view corresponding to FIG. 1B, showing a state in which the first metal 18 is subjected to the wet-back process. The first metal 18 has a characteristic in which a volume of the metal increases when it is heated to be molten and coagulated. Therefore, walls of the openings 14 of the resist 16 are subjected to a force generated by the deformation of the adjacent first metal 18. Therefore, the lower portions of the walls of the openings 14 of the resist 16 are expanded. Accordingly, the resist 16 is partially separated from the LSI wafer 10 (or the resist 16 is put into a state in which it could be easily separated from the LSI wafer 10.)

Figure 2C:
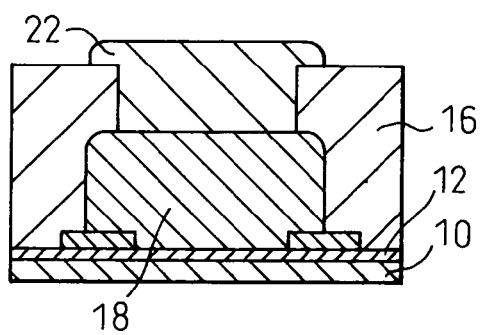

In FIGS. 1C and 2C, a second metal 22 is supplied into the openings 16 just on the first metal 18. In this case, the second metal 22 is also supplied by means of electrolytic plating. The second metal 22 is formed to a height so that it can protrude from the surface of the resist 16, that is, the second metal 22 is formed in such a manner that a portion of the second metal 22 covers a surface of the resist 16 in a mushroom shape. However, it should be noted that portions of the second metal 22 of the second metal 22 do not contact with each other on the surface of the resist 16.

The second metal 22 contains at least one of Sn, Ag, In, Cu, Zn and Sb. In this embodiment, alloy of Sn—Bi or alloy of Sn—Ag is used.

Figure 2D:
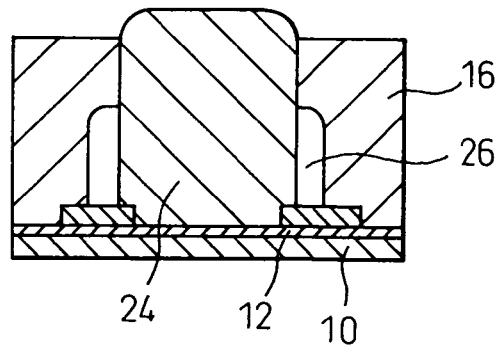

In FIGS. 1D and 2D, the wet-back process is conducted. That is, the first metal 18 and the second metal 22 are heated to be molten and then coagulated. The first metal 18 and the second metal 22 are thus molten and mixed with each other, resulting in the solder bumps 24 of the target alloy. When the wet-back process is conducted while the first metal 18 and the second metal 22 are left on the resist 16, each solder bump 24 is shaped into a tall column corresponding to the shape of the opening 14 of the resist 16, and the shape of the top of each solder bump 24 becomes substantially flat.

When the first metal 18 and the second metal 22 are molten and mixed with each other, the characteristic of the first metal 18, in which the volume increases, is abolished, and an increased portion in the volume of the first metal 18 is contracted by the surface tension, so a gap 26 is formed between the wall of the solder bump 24 and the wall of the opening 14 of the resist 16.

In FIG. 1D, the resist 16 is separated and removed by solvent. At this time, the resist 16 is put into a state in which the resist 16 can be easily separated and the solvent can get into the gap 26 formed between the wall of the solder bump 24 and the wall of the opening portion 14 of the resist 16, and easily penetrate the interface between the resist and the wafer, so the resist 16 can be surely separated from the LSI wafer 10. For the above reasons, even if the first metal 18 and the second metal 22, which will become the solder bumps, are formed to such a height that the metal protrudes from the surface of the resist 16 into a mushroom-shape, as shown in FIG. 1C, no remnants of the resist 16 are left when the resist 16 is separated. Therefore, even in the case of forming the solder bumps 24 at narrow pitches, it is possible to form the solder bumps 24 in which the height thereof is large and which contain a sufficiently large quantity of solder.

Next, the conductor 20 used for plating is dissolved and removed by an etching solution.

In this connection, the reason why the quantity of Bi is determined to be 20 to 70 wt % is, as follows; if the quantity of Bi is not more than 20 wt %, a quantity of deformation of the resist caused by expansion of the volume is so small that an influence given to the resist is small, and if the quantity of Bi is not less than 70 wt %, the melting point increases or the mechanical property is deteriorated and the reliability of joining is lowered.

Figure 4A:
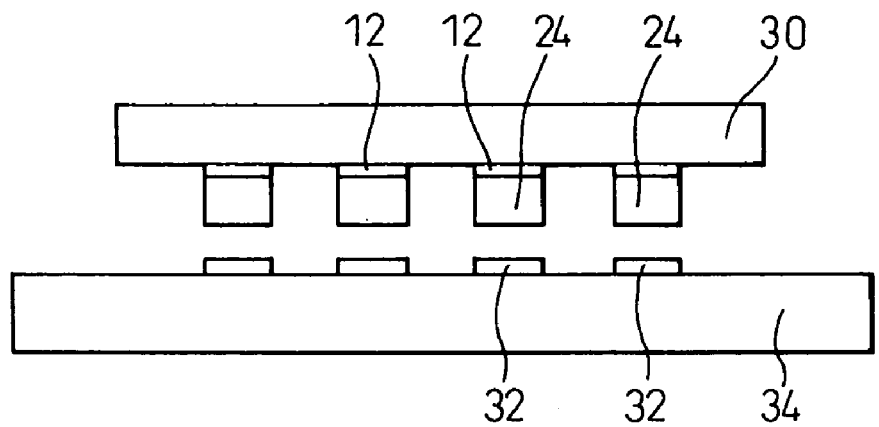
FIGS. 4A to 4C are views showing an example in which a semiconductor device is mounted to a wiring circuit board.
Figure 4B:
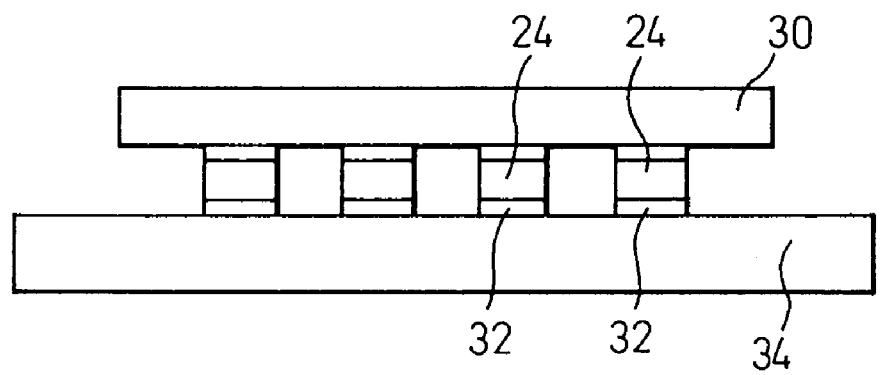
Figure 4C:
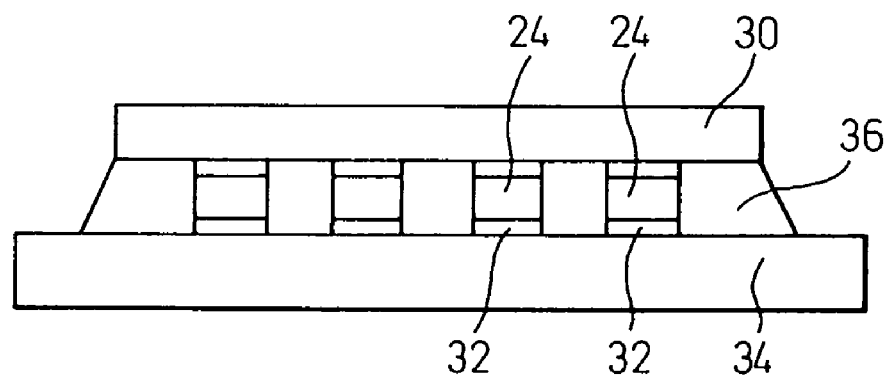
Figure 5A:
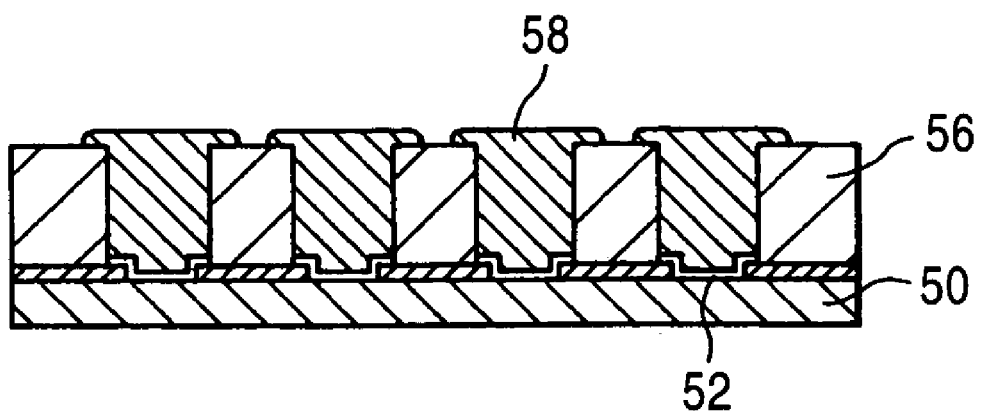
FIGS. 5A to 5C are views showing a method of forming solder bumps in a conventional example.
Figure 5B:
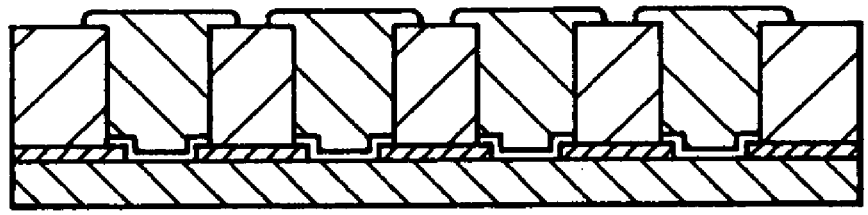
Figure 5C:
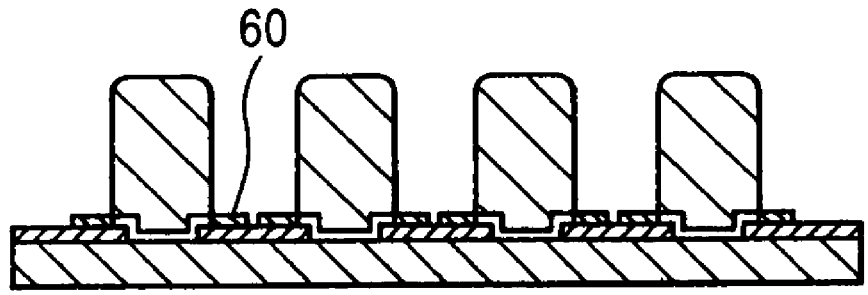

FIGS. 4A to 4C are views showing an example in which the semiconductor device is mounted on a wiring circuit board. After the solder bumps 24 are formed, the LSI wafer 10 is diced into a large number of LSI chips 30. In this connection, the solder bumps 24 can be formed on the wiring circuit board. The LSI chip 30 having the solder bumps 24 is mounted to the printed wiring board 34 having electrodes 32.

In FIGS. 4A and 4B, the LSI chip 30 and the printed wiring board 34 are positioned relative to each other, and the LSI chip 30 is pressed against the printed wiring board 34. At this time, at least one of the LSI chip 30 and the printed wiring board 34 is heated. The heating temperature is set at a temperature not higher than the melting point of the solder bumps 24, and the solder bump 24 is made in abutment with the electrode 32 of the printed wiring board 34 and pressurized.

In FIG. 4C, under the condition that the solder bumps 24 are pressed against the electrodes 32 on the printed wiring board 34, an under-fill material 36 is filled between the LSI chip 30 and the printer wiring board 34 in a region including jointed portions of the solder bumps 24 and the electrodes 32. That is, the solder bumps 24 are sealed with resin. In this way, the solder bumps 24 and the electrodes 32 are mechanically and electrically connected to each other.

Further, specific examples and a comparative example of forming the solder bumps and mounting the semiconductor device will be explained below.

EXAMPLE 1

A dry film resist 16 (an acrylate film manufactured by Hitachi Kasei and having the thickness of 30 μm) is bonded to the surface of the LSI wafer 10 having 2000 electrodes, the pitch size of 50 μm, and the electrode pad diameter of 30 μm, at the temperature of 100° C., and the openings 14 having the diameter of φ30 μm are formed above the electrodes by exposure and development. Concerning the developing agent, n-methyl 2-pyrrolidone is used.

In the thus formed openings 14, the first metal (Bi) 18 having the film thickness of approximately 15±1 μm, is formed by means of electrolytic plating. After that, flux (manufactured by α Metals Co.) is applied, and then the wet-back process is conducted at a temperature not lower than the melting point.

Next, the second metal (Sn—Bi alloy) 22 having the film thickness of 15±1 μm, is formed by means of electrolytic plating (the Sn—Bi alloy plating solution manufactured by Ishihara Yakuhin Co.). After that, flux is applied, and then the wet-back process is conducted at a temperature not lower than the melting point. Finally, the dry film resist 16 is removed by a 5% mono-ethanol amine water solution. As a result, excellent solder bumps 24 could be manufactured without resist remnants.

After that, the semiconductor chip 30 is mounted to the wiring board (BT resin) 34, by positioning the electrodes relative to each other, applying the under-fill agent in which silica power (the average particle size of 4 μm) is mixed with epoxy flux fill (manufactured by Senjyu Kinzoku) by a ratio of 50 to 80 wt %, and then reflowing to join them at the temperature profile with the maximum temperature not lower than 230° C. (the melting point 138° C.) for about 5 minutes while a load of 20 g is given. As a result, it is confirmed that excellent joining portions are formed. Concerning the reliability of connection, the temperature cycle test from −55 to 125° C. is conducted for 2000 cycles and, as a result of the test, an increase in the resistance is not more than 10%. In this way, it was confirmed that the reliability of connection is high.

EXAMPLE 2

A dry film resist 16 (an acrylate film manufactured by Hitachi Kasei and having the film thickness of 70 μm) is bonded to the surface of the LSI wafer 10 having 2000 electrodes, the pitch size of 150 μm, and the electrode pad diameter of 70 μm, at the temperature of 100° C., and the openings 14 having the diameter of φ70 μm, are formed by exposure and development. Concerning the developing agent, n-methyl 2-pyrrolidone is used.

In the thus formed openings 14, the first metal (Bi) 18 having the film thickness of approximately 35±5 μm, is formed by means of electrolytic plating. After that, flux (manufactured by α Metals Co.) is applied, and then the wet-back process is conducted at a temperature not lower than the melting point.

Next, the second metal (Sn—Bi alloy) having the film thickness of 35±5 μm, is formed by means of electrolytic plating (the Sn—Bi alloy plating solution manufactured by Ishihara Yakuhin Co.). After that, flux is applied, and then the wet-back process is conducted at a temperature not lower than the melting point. Finally, the dry film resist 16 is removed by a 5% mono-ethanol amine water solution. As a result, excellent solder bumps 24 could be manufactured without resist remnants.

The semiconductor chip 30 is mounted to the wiring board (BT resin) 34, by positioning the electrodes relative to each other, applying the under-fill agent in which silica power (the average particle size of 4 μm) is mixed with epoxy flux fill (manufactured by Senjyu Kinzoku) by a ratio of 50 to 80 wt %, and then reflowing to join them by a temperature profile with the maximum temperature not lower than 250° C. (the melting point 221° C.) for about 3 minutes while a load of 20 g is given. As a result, it is confirmed that excellent joining portions are formed. Concerning the reliability of connection, the temperature cycle test from −55 to 125° C. is conducted for 2000 cycles and, as a result of the test, an increase in the resistance was not more than 10%. In this way, it is confirmed that the reliability of connection is high.

EXAMPLE 3

A dry film resist 16 (an acrylate film manufactured by Hitachi Kasei and having the film thickness of 100 μm) is bonded to the surface of the LSI wafer 10 having 2000 electrodes, the pitch size of 200 μm, and the electrode pad diameter of 100 μm, at the temperature of 100° C., and the openings 14 having the diameter of φ100 μm, is formed by exposure and development. Concerning the developing agent, n-methyl 2-pyrrolidone is used.

In the thus formed openings 14, the first metal (Bi) 18 having the film thickness of approximately 50±1 μm, is formed by means of electrolytic plating. After that, flux (manufactured by α Metals Co.) is applied, and then the wet-back process is conducted at a temperature not lower than the melting point.

Next, the second metal (In) 22 having the film thickness of 50±1 μm, is formed by means of electrolytic plating (the In plating solution manufactured by Daiwa Kasei Co.). After the flux is applied, the wet-back process is conducted at the temperature not lower than the melting point. Finally, the dry film resist 16 is removed by 5% mono-ethanol amine water solution. As a result, excellent solder bumps 24 could be manufactured without resist remnants.

The semiconductor chip 30 is mounted to the wiring board (BT resin) 34, by positioning the electrodes relative to each other, applying the under-fill agent in which silica power (the average particle size of 4 μm) is mixed with epoxy flux fill (manufactured by Senjyu Kinzoku) by a ratio of 50 to 80 wt %, and reflowing to join them by a temperature profile with a maximum temperature not lower than 170° C. for about 5 minutes (the melting point 109° C.) while a load of 20 g is given. As a result, it was confirmed that excellent joining portions are formed. Concerning the reliability of connection, the temperature cycle test from −55 to 125° C. was conducted for 2000 cycles, and as a result of the test, an increase in the resistance is not more than 10%. In this way, it is confirmed that the reliability of connection was high.

COMPARATIVE EXAMPLE

The dry film resist is bonded to the surface of the LSI wafer having 2000 electrodes, the pitch size of 50 μm, and the electrode pad diameter of 30 μm, at the temperature of 100° C., and the openings having the diameter of φ30 μm, is formed above the electrodes by exposure and development. Concerning the developing agent, n-methyl 2-pyrrolidone is used.

In the thus formed openings, Sn—Bi alloy having the film thickness of approximately 35±5 μm, is formed by means of electrolytic plating. After that, flux (manufactured by α Metals Co.) is applied, and then the wet-back process is conducted at the temperature not lower than the melting point. The dry film resist is removed by mono-ethanol amine water solution. As a result, the adhesive resist remnants are left in the neighborhoods of the bumps. Further, adhesive resist remnants are left in the neighborhoods of the interfaces between the solder bump and the electrode. Therefore, it is impossible to conduct cleaning, and it is impossible to manufacture excellent solder bumps.

As explained above, according to the present invention, it is possible to form excellent solder bumps on a semiconductor element having electrodes, the pitch size of which is not more than 100 μm and further the pitch size of which is not more than 50 μm. Further, when the semiconductor element and the circuit wiring board are joined to each other, a sufficiently high joining reliability can be ensured.

The invention claimed is:

1. A method of manufacturing a semiconductor device comprising, in the recited order, the steps of:
    forming an insulating film on a surface of a semiconductor element or a circuit wiring board having electrodes on the surface thereof;
    forming openings in the insulating film by patterning the insulating film and then removing portions of the insulating film above the electrodes;
    supplying a first metal into the openings;
    heating the first metal to melt and coagulate the first metal, wherein the first metal has a characteristic in which a volume thereof is increased when it is heated to be molten and coagulated in such a manner that the diameter of the opening of the insulating layer is increased;
    supplying a second metal into the openings on the coagulated first metal;
    heating the first metal and the second metal to melt and coagulate the first metal and the second metal; and
    removing the insulating film.

2. A method of manufacturing a semiconductor device according to claim 1, wherein the first metal and the second metal are supplied into the openings by an electrolytic plating method or a vapor-deposition method.

3. A method of manufacturing a semiconductor device according to claim 1, wherein the first metal contains as a component thereof Bi or an alloy including Bi as a primary component.

4. A method of manufacturing a semiconductor device according to claim 3, wherein a content of Bi in the first metal is in the range from 20 to 70 wt % of the sum of the first metal and the second metal.

5. A method of manufacturing a semiconductor device according to claim 1, wherein the second metal contains as a component thereof at least one of Sn, Ag, In, Cu, Zn and Sb.

6. A method of manufacturing a semiconductor device according to claim 1, wherein the second metal is formed to such a height that it protrudes from the opening.

7. A method of manufacturing a semiconductor device according to claim 1, wherein the insulating film comprises a dry film resist.

8. A method of manufacturing a semiconductor device according to claim 1, wherein the first metal and the second metal are supplied into the openings by an electrolytic plating method.

* * * * *